United States Patent [19]

Shinozaki et al.

[11] 4,106,049
[45] Aug. 8, 1978

[54] SEMICONDUCTOR DEVICE

[75] Inventors: Satoshi Shinozaki; Yoshio Nishi, both of Yokohama; Yoshihisa Mizutani, Tokyo, all of Japan

[73] Assignee: Tokyo Shibaura Electric Co., Ltd., Japan

[21] Appl. No.: 770,270

[22] Filed: Feb. 22, 1977

[30] Foreign Application Priority Data

Feb. 23, 1976 [JP] Japan .................................. 51-18713
Feb. 23, 1976 [JP] Japan .................................. 51-18714

[51] Int. Cl.² ............................................ H01L 27/02
[52] U.S. Cl. ................................... 357/46; 357/40; 357/48; 357/92
[58] Field of Search ......................... 357/48, 40, 92

[56] References Cited

U.S. PATENT DOCUMENTS 3,801,836  4/1974  Castrucci et al. ...................... 357/48
3,971,059  7/1976  Dunkley et al. ....................... 357/48

Primary Examiner—Edward J. Wojciechowicz
Attorney, Agent, or Firm—Finnegan, Henderson, Farabow & Garrett

[57] ABSTRACT

A semiconductor device comprises a D.C. voltage supply region comprising a semiconductor substrate of one conductivity type having a first layer of high impurity concentration at least at its surface, and a second layer of low impurity concentration and of the same conductivity type as that of the D.C. voltage supply region, provided thereon and formed interiorly with a thin buried layer of the opposite conductivity type to that of the second layer at the vicinity of the D.C. voltage supply region. A grounding region of said opposite conductivity layer is provided in a manner to surround a specified region of the second layer and extend from the surface of the second layer to the buried layer, said surrounded specified region serving as a signal input region. In the surface of the signal input region, there is provided at least one signal output region constituting a diode together with the signal input region.

12 Claims, 14 Drawing Figures

SEMICONDUCTOR DEVICE

BACKGROUND OF THE INVENTION

I. Field of the Invention

This invention relates to a semiconductor device for use in a logic circuit prepared from integration of bipolar transistors, and more particularly to a semiconductor device of said type capable of being integrated with high density and operated with lower power consumption.

II. Description of the Prior Art

With a bipolar transistors-integrated semiconductor device, a separation layer for separating one element from another is necessary. This causes a process for manufacturing the semiconductor device to become complicated and simultaneously causes a rise of difficulties in integrating elements with high density. In order to solve this problem, an IIL-structural semiconductor device is being exploited which eliminates the necessity of providing such a separation layer and therefore makes high-density integration possible and yet operates with low power consumption.

A conventional IIL-structural semiconductor device, as well known, is constructed such that an n type epitaxial layer to serve as a base region or emitter region is formed on an $n^+$ type silicon substrate to serve as a grounding region; in the n type epitaxial layer a $p^+$ type layer used as a D.C. voltage supply region and a p type layer used as a signal input region are formed closely to each other; and in the p type layer at least one $n^+$ type layer to serve as a signal output region is formed. An npn transistor operating as an inverter is constructed as a so-called inverted type transistor wherein the n type epitaxial layer, p type layer and $n^+$ type layer are used as the emitter, base and collector, respectively, while a pnp transistor operating as an injector is constructed as a lateral transistor wherein the $p^+$ type layer, n type epitaxial layer and p type layer are used as the emitter, base and collector, respectively.

The semiconductor device having the foregoing IIL structure has its npn transistor formed into an inverted structure to provide the advantages that a separation layer for separating one element from another is unnecessary; the degree of integration can be enhanced owing to the pnp and npn transistors co-owing two regions; and yet the logical amplitude and power consumption are both small or low.

However, the conventional IIL-structural semiconductor device still involves therein some problems. For example, the pnp transistor as an injector is of lateral type; and therefore the base width thereof fails to be narrowed to a sufficient extent, while the current amplification factor thereof is low. Further, the current flowing from the emitter in a vertical direction is consumed uselessly. In addition, the npn transistor as an inverter is formed into an inverted type, and therefore the current amplification factor thereof is also low and, since the base layer thereof is usually formed by diffusion, this base layer is applied with a decelerating field attributed to non-uniformity of impurity concentration.

The above-mentioned problems have heretofore been causes of interruption in making the IIL-structural semiconductor device into a type capable of reduction in power consumption and high-speed operation.

U.S. Pat. No. 3,823,353 discloses a monolithic semiconductor-integrated structure capable of being subjected to high-density integration and low in power consumption. This integrated structure has a semiconductor-integrated structure having disposed on a substrate of a first conductivity type a first layer of a second conductivity type, a second layer of said first conductivity type and a third layer of said second conductivity type in the order mentioned, and is constructed such that it is provided with a first region of said first conductivity type extended from the surface of said structure at least to the second layer in a manner to surround a specified region of the third layer, and with a second region of said second conductivity type extended from the surface of said structure to the first layer through the first region.

SUMMARY OF THE INVENTION

Accordingly, the object of the invention is to provide a semiconductor device low in power consumption and capable of high-speed operation and being subjected to high-density integration.

A semiconductor device according to the invention comprises a D.C. voltage supply region comprising a semiconductor substrate of one conductivity type having a first layer of high impurity concentration at least at its surface; a second layer of low impurity concentration and of the same conductivity type as that of the voltage supply region, provided thereon; a third thin layer of the opposite conductivity type to said one conductivity type, buried in the second layer at the vicinity of the voltage supply region; a grounding region of said opposite conductivity type which surrounds a specified region of the second layer and extends from the surface of the second layer to the third layer and provides a signal input region as defined by the surrounded specified region; and at least one signal output region provided in the surface of the signal input region at a position spaced apart from the grounding region and constituting a diode together with the signal input region. In this semiconductor device, the D.C. voltage supply region, the third layer and the signal input region constitute a vertical transistor of one polarity, while the third layer, the signal input region and the signal output region constitute a vertical transistor of the opposite polarity to that of the vertical transistor of one polarity.

DETAILED DESCRIPTION OF THE PREFERRED EMBODIMENTS

Figure 1:
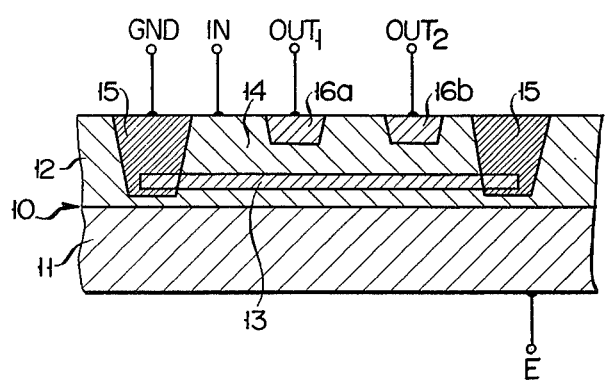
FIG. 1 is a sectional view showing part of an example of a semiconductor device according to the invention.

This invention will now be described by reference to FIGS. 1 through 6. Throughout the Figures, the same parts and sections are denoted by the same reference numerals.

As shown in FIG. 1, a semiconductor device 10 of the invention has a semiconductor substrate of one conductivity type and of high impurity concentration, for example, a p$^+$ type silicon substrate 11, which is connected to a D.C. voltage supply terminal E. (A region to be connected in this way to the D.C. voltage supply terminal E is hereinafter referred to as a "D.C. voltage supply region" in the specification and claims). In this respect, the semiconductor device of the invention is fundamentally different from a conventional one having an IIL structure. The semiconductor substrate constituting the D.C. voltage supply region does not have to be doped as a whole with impurities with high concentration, but has only to have a high impurity concentration layer at its surface.

On the silicon substrate 11 is formed a low impurity concentration (p$^-$) layer 12 of the same conductivity type as that of the silicon substrate 11. Within the p$^-$ layer 12 a thin buried layer 13 of the opposite conductivity type to that of the p$^-$ layer 12 is partially provided at a position near to an interface between the p$^-$ layer 12 and the silicon substrate 11 but spaced apart from that interface.

Formed in the p$^-$ layer 12 is a region 15 of high impurity concentration of said opposite conductivity type which surrounds a specified region 14 of the p$^-$ layer 12 and extends from the surface of the p$^-$ layer 12 to the buried layer 13. To the region 15 is connected a grounding terminal GND. (In the specification and claims a region to be connected to a grounding terminal is hereinafter referred to as a "grounding region"). To the region 14 surrounded by the grounding region 15 is connected a signal input terminal IN, said region 14 thus forming a "signal input region" as defined in accordance with the above-mentioned manner of definition. In the signal input region 14 are formed semiconductor layers of said opposite conductivity type, namely, n$^+$ layers 16a, 16b to constitute diodes together with the input region 14, respectively. These n$^+$ layers 16a, 16b are connected to signal output terminals OUT$_1$, OUT$_2$, respectively, thus to constitute "signal output regions", respectively. The grounding region 15 separates the elements surrounded thereby from other elements.

In the semiconductor device having the foregoing IIL structure, each of an injector and inverter is constituted by a vertical transistor. Namely, a vertical pnp transistor whose emitter, base and collector are constituted by the p$^+$ silicon substrate 11, the n$^+$ buried layer 13 and p$^-$ region 14 constitutes the injector, while an npn transistor whose emitter, base and collector are constituted by the n$^+$ buried layer 13, the p$^-$ region 14 and the n$^+$ layer 16a, 16b constitutes the inverter.

Figure 2:
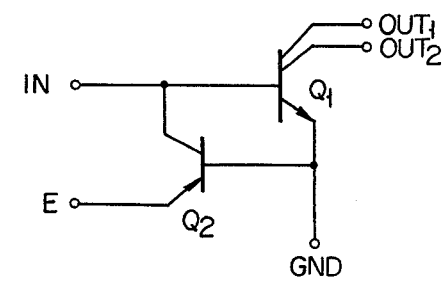
FIG. 2 is a circuit diagram showing an equivalent circuit of the semiconductor device shown in FIG. 1.

An equivalent circuit of the IIL-structural semiconductor device is the same as that of a conventional one as shown in FIG. 2, and is the same as the latter equivalent circuit also in terms of operational principle. When a bias voltage of about 0.8V relative to the grounding terminal GND is applied to the D.C. voltage supply terminal E, holes are supplied to the p$^-$ region 14 through the operation of the pnp transistor Q2. When, under this condition, a bias voltage of about 0.7V is applied to the signal input terminal IN, the base-emitter junction of the npn transistor Q1 is subjected to forward bias, whereby the transistor Q1 is rendered "ON", so that the output terminals OUT$_1$, OUT$_2$ have a voltage of about 0V. When, on the other hand, the signal input terminal IN is allowed to have a voltage level of 0V, the npn transistor Q1 is not subjected to injection of electrons from the emitter to the base, thus to be rendered "OFF", so that the potential of the output terminals OUT$_1$, OUT$_2$ is determined depending upon the next stage power source voltage (not shown).

The IIL-structural semiconductor device of the invention can be manufactured by a simple process by the use of ion inplantation technique. Hereinafter, an example of the process for manufacturing the IIL-structural semiconductor device will be explained by reference to FIGS. 3A to 3G.

Figure 3A:
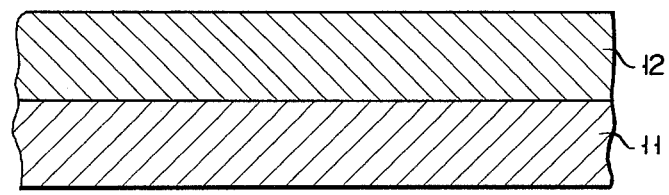
FIGS. 3A to 3G are views showing in sequence the steps involved in a process for manufacturing a semiconductor device according to the invention.
Figure 3B:
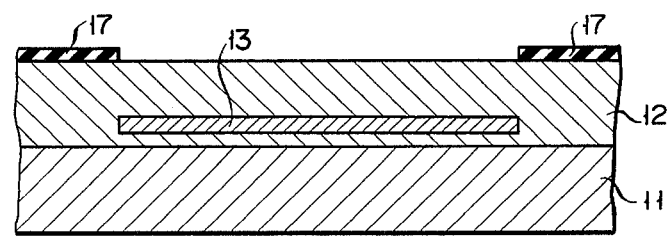
Figure 3C:
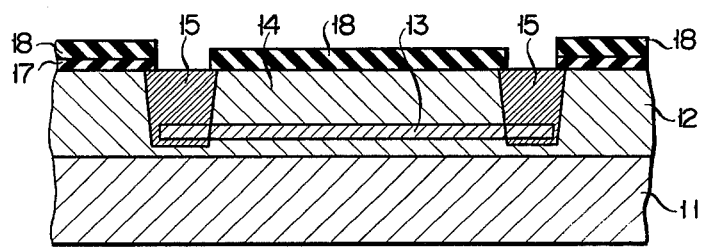

As shown in FIG. 3A, on the p$^+$ silicon substrate 11 having a high impurity concentration of $5 \times 10^{18}$ to $5 \times 10^{19}$ atoms/cm$^3$ is epitaxially grown by a customary method the p$^-$ layer 12 having an impurity concentration of $1 \times 10^{16}$ to $1 \times 10^{17}$ atoms/cm$^3$ and a thickness of about 1 $\mu$m. Subsequently, a SiO$_2$ film 17 having a thickness of about 1000Å is formed on the p$^-$ layer 12 by a usual thermal oxidation process (for example, by heating at 1000° C in an atmosphere of wet O$_2$). Thereafter, the SiO$_2$ film 17 is bored with an opening by photoetching a prescribed extent of region of the film 17. Then, the use of the remaining photoresist (not shown) as a mask, phosphorus ions are implanted in the p$^-$ layer 12 at about 400 KeV to an extent of $1 \times 10^{13}$ atoms/cm$^2$ to $1 \times 10^{14}$ atoms/cm$^2$. Thus is formed in the p$^-$ layer 12 a thin n+ buried layer 13, about 0.3$\mu$ thick, having a peak of phosphorus concentration at a position spaced about 0.5$\mu$m from the surface of the p$^-$ layer 12 (See FIG. 3B).

Subsequently, a silicon oxide film 18 is deposited on the SiO$_2$ film 17 to a thickness of 5000Å by chemical vapor deposition. Thereafter, boring is performed so as to permit the resultant opening to surround a specified region to serve as a signal input region 14. Then, with the use of phosphorus oxychloride (POCl$_3$) as a diffusion source phosphorus is diffused at 1000° C to form an n$^+$ layer 15 having a surface impurity concentration of $1 \times 10^{20}$ atoms/cm$^3$ or more and a depth of 0.5 to 0.8$\mu$m so as to permit it to extend from the surface of the p$^-$ layer 12 to the n$^+$ buried layer 13 (See FIG. 3C).

Figure 3D:
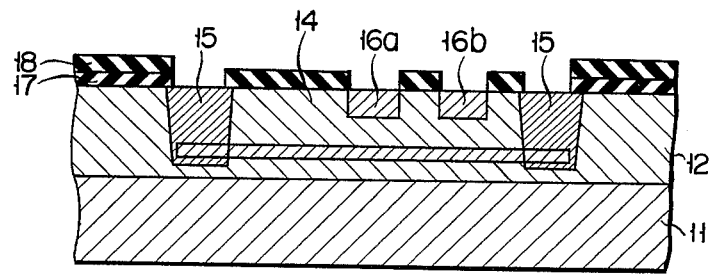

Subsequently, the silicon oxide film 18 is bored with an opening at a prescribed portion thereof and then phosphorus ions inplantation is carried out, by the ion inplantation method, at 100 KeV to an extent of $1 \times 10^{13}$ to $1 \times 10^{14}$ atoms/cm$^2$, thereby to form n$^+$ layers 16a, 16b to serve as signal output regions (See FIG. 3D).

Subsequently, a silicon oxide film 19 is once again deposited on the film 18 by chemical vapor deposition, and then an opening is bored at a prescribed portion of the film 19. Thereafter, boron ions are implanted at 30 KeV shallowly to an extent of $1 \times 10^{14}$ to $1 \times 10^{15}$ atoms/cm$^2$, thereby to form a p$^+$ layer 20 at that portion of the signal input region 14 which is to serve as an electrode drawing-out portion, and also to form p$^+$ layers 21, between the signal output regions 16a, 16b and between these regions and the grounding regions 15 (See FIG. 3E). These p$^+$ layers 20, 21 are unnecessary when they are considered from the viewpoint of operational principle. However, since, as above described, the base region of the inverter is an epitaxial layer of low concentration, the series resistance of the base region is increased to cause a degradation of the semiconductor device characteristics especially under application of a large current to the semiconductor device. According to one embodiment of the invention, therefore in order to cause a decrease in the series resistance, the above p$^+$ layers 20, 21 of high impurity concentration are provided. Owing to the existence of the p$^+$ layer 20, an electrode of the signal input terminal to be connected to the "signal input region" can be brought into good ohmic contact with the same, and further production of an n type inversion layer at the p type low-impurity epitaxial layer surface can be prevented. Such production of an n type inversion layer can also be prevented by previously implanting boron ions into the whole surface of the low-impurity epitaxial layer to the extent that the surface of the n type regions 15, 16 is not changed into p type.

After the formation of the above-mentioned prescribed semiconductor regions, the resultant semiconductor device is subjected to thermal treatment under an oxidizing atmosphere of 900° C in order to recover damaged layers produced during the formation of the $n^+$ buried layer 13, $n^+$ layers 16a, 16b and $p^+$ layers 20, 21 by the use of the ion inplantation technique. During this thermal treatment process, a silicon oxide film 22 is formed on the surface of the $p^+$ layers 20, 21 (See FIG. 3F).

Figure 3E:
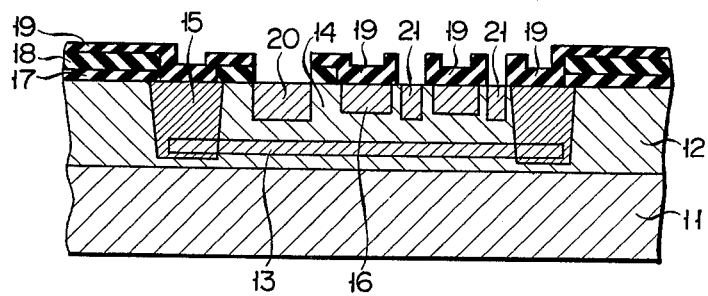
Figure 3F:
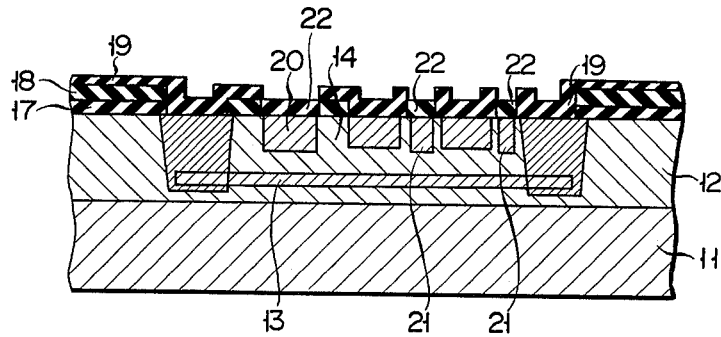
Figure 3G:
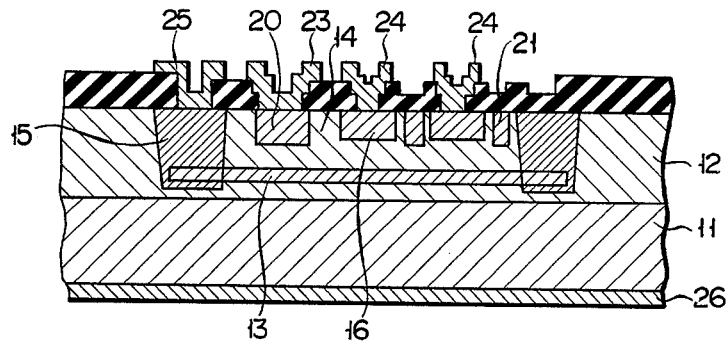

Finally, contact holes are formed at prescribed portions, and the resultant semiconductor device is subjected to deposition of aluminum and patterning, thus to form a signal input terminal electrode 23, signal output terminal electrodes 24a, 24b and a grounding terminal electrode 25 on the surface of the semiconductor device and also to form a D.C. voltage supply terminal electrode 26 on the whole rear surface of the semiconductor device (See FIG. 3G).

Figure 4A:
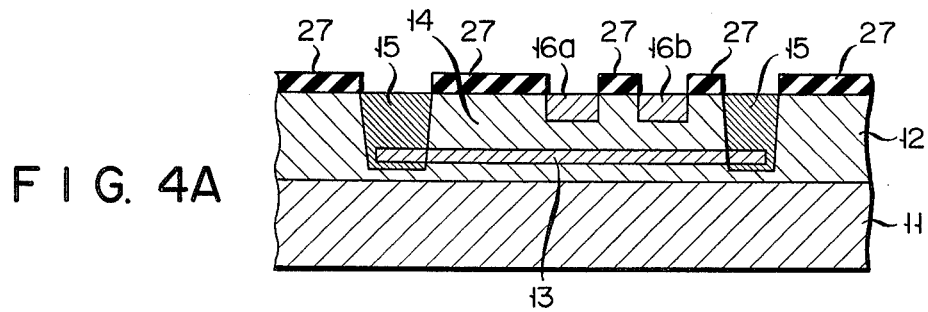
FIGS. 4A to 4C are views showing in sequence the steps involved in another process for manufacturing a semiconductor device according to the invention.
Figure 4B:
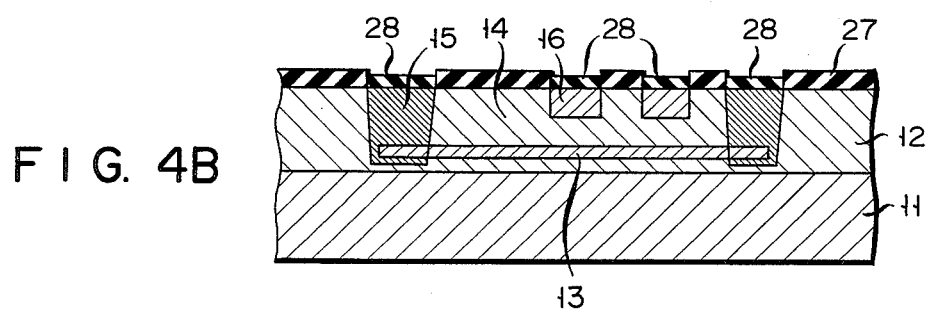

The above-mentioned example of the process for manufacturing the IIL-structural semiconductor device was described in regards to the use of only a silicon oxide film as a mask for doping impurities, but the process also permits the concurrent use of a silicon nitride ($Si_3N_4$) film. As shown in FIG. 4A, for example, in substantially the same manner as in FIGS. 3A to 3D except that a silicon nitride film 27 is used in place of the silicon nitride films 17 and 18, a $p^-$ layer 12 is formed on the $p^+$ silicon substrate 11, and on the $p^-$ layer 12 are formed a buried layer 13, an $n^+$ layer 15 and $n^+$ layers 16a, 16b. Subsequently, in order to recover damaged layers produced during the formation of the buried layer 13 and $n^+$ layers 16a, 16b by the use of the ion inplanation technique, the resultant semiconductor device is thermally treated under an oxidizing atmosphere of 1000° C. Through this thermal treatment, a silicon oxide film 28 about 2000Å thick is formed on the surface of the $n^+$ layers 16a, 16b and $n^+$ layer 15 (FIG. 4B).

Figure 4C:
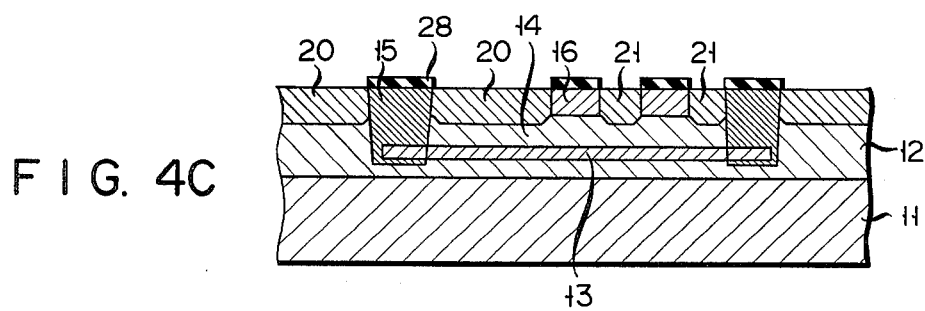

Subsequently, the silicon nitride film 27 is removed by etching, and in the same manner as in the step shown in FIG. 3E boron ions implantation is carried out, or alternatively boron diffusion from the boron-doped oxide is carried out, thereby to form $p^+$ layers 20 and 21 (see FIG. 4C). According to this removal by etching, the mask-boring process based on the use of the photoetching method used in the step shown in FIG. 3E becomes unnecessary as a result of being replaced by the removal of the silicon nitride film 27, so that the process for manufacturing the IIL-structural semiconductor device is simplified by that extent.

Subsequently, a silicon oxide film is deposited by chemical vapor deposition on the entire surface of the resultant semiconductor device, and the semiconductor device, thus obtained is thermally treated at 1000° C to cause a recovery of damaged layers produced during the formation of the $p^+$ layers 20, 21 by the use of the ion implantation technique. Thereafter, in the same manner as in the step shown in FIG. 3G, a signal input terminal electrode 23, signal output terminal electrode 24, grounding terminal electrode 25 and D.C. voltage supply terminal electrode 26 are formed, whereby an IIL-structural semiconductor device having the same construction as shown in FIG. 3G is obtained.

The semiconductor device of the invention having the above-mentioned IIL structure, as previously described, is fundamentally different from a conventional IIL-structural semiconductor device in that the pnp transistor as an injector is formed into a vertical type, and can therefore be integrated with by that extent higher density than in a conventional IIL-structural semiconductor device. Further, according to the invention, the buried layer 13 to serve as the base of the vertical pnp transistor is formed thin by the ion implantation technique, and therefore the base width of the vertical pnp transistor is made narrower than in the case of a conventional IIL-structural semiconductor device whose base width is determined by the mask width, the diffusion depth and so on. Besides, according to the invention, the emitter concentration can be increased by causing an increase in the difference between the impurity concentration of the silicon substrate 11 and that of the $p^-$ layer 12, so that the current amplification factor of the pnp transistor can be increased. Further, since the pnp transistor of the invention is of a vertical type, a current loss in the vertical direction, which was a problem of the conventional IIL-structural semiconductor device, does not rise as a problem. Namely, a useless power consumption comes to decrease extremely.

On the other hand, according to the invention, in the npn transistor serving as an inverter, an epitaxial-growth layer is used as its base, and as a result a distribution of impurity concentration becomes uniform. This prevents application of a decelerating field to the npn transistor. In addition, in the npn transistor according to the invention, the emitter concentration is made higher than the base concentration, and therefore the current amplification factor thereof is great, while the frequency characteristics thereof are also improved.

Figure 5:
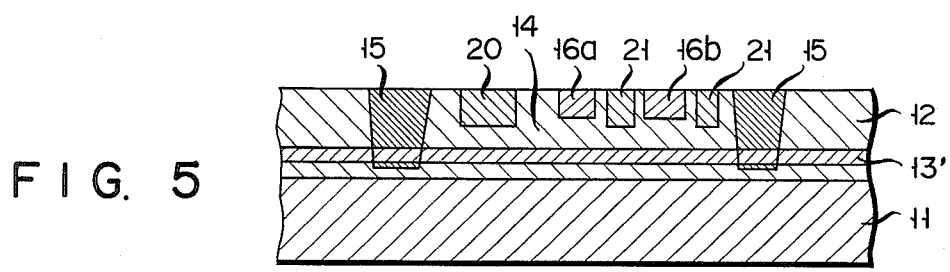
FIG. 5 is a sectional view showing part of another example of the semiconductor device according to the invention.

FIG. 5 shows an IIL-structural semiconductor device which is constructed such that a buried layer 13' is provided in the $p^-$ layer 12 throughout the same, being not constructed such that a buried layer is partially provided in oneelement region. In the above-mentioned example of the process for manufacturing the IIL-structural semiconductor device, the buried layer was partially provided, but by providing the buried layer in the $p^-$ layer throughout the same as shown in FIG. 5, the formation of the oxide film 17 and the photoetching process incident thereto can be omitted.

Figure 6:
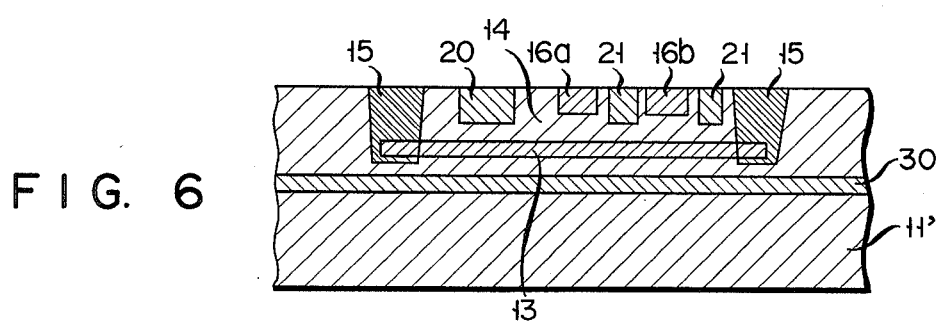
FIG. 6 is a sectional view showing part of still another example of the semiconductor device according to the invention.

FIG. 6 shows an IIL-structural semiconductor device which is constructed such that specified semiconductor regions are formed in the silicon substrate without using the epitaxial-growth layer 12. For example, boron ions are implanted at 350 KeV in a $p^-$ silicon substrate 11' having an impurity concentration of $1 \times 10^{16}$ atoms/cm$^3$ from the surface thereof to an extent of $10^{15}$ atoms/cm$^2$, thereby to form a $p^+$ layer 30 having a peak concentration of impurities at a depth of about 0.8μm from the surface of the silicon substrate, and this layer 30 is thus used as the emitter of the pnp transistor as the injector. Namely, a substrate portion below the $p^+$ layer 30 corresponds to the silicon substrate 11. In this specification and claims the semiconductor substrate is defined to mean a one including such a $p^+$ layer 30. In this sense, the semiconductor substrate shown in FIG. 6 can be defined as having a high impurity concentration layer 30 at its surface. Thereafter, specified semiconductor regions are formed in the semiconductor substrate in the same manner as in the above-mentioned example of the process for manufacturing the IIL-structural semiconductor device.

In the above-mentioned example including the one shown in FIG. 6, a signal output region constituting a diode together with the p⁻ layer is formed with this diode by the semiconductor region 14 of the opposite conductivity type to that of this p⁻ layer. But this invention is not limited thereto, and, for example, a Schottky diode may be formed by providing metal layer on the p⁻ layer.

What we claim is:

1. A semiconductor device comprising:
    a D.C. voltage supply region comprising a semiconductor substrate of one conductivity type having at least a surface layer of high impurity concentration,
    a first layer of the same conductivity type as that of the voltage supply region provided on said surface layer and having an impurity concentration lower than that of the surface layer,
    a thin second layer of the opposite conductivity type to said one conductivity formed completely in the first layer and having an impurity concentration intermediate that of said substrate and said first layer,
    a grounding region of said opposite conductivity type formed in the first layer and surrounding a specified region thereof, which extends from the outside surface of the first layer to the second layer and provides a signal input region as defined by the surrounded specified region, and
    at least one signal output region provided in the surface of the signal input region at a position spaced apart from the grounding region and constituting a diode therewith,
    wherein the surface layer, the second layer and the signal input region constitute a vertical transistor of one polarity, and the second layer, the signal input region and the signal output region constitute a vertical transistor of the opposite polarity.

2. A semiconductor device according to claim 1, which further comprises a third layer of high impurity concentration and of said one conductivity type, formed in the signal input region between the grounding region and the signal output region and between signal output regions.

3. A semiconductor device according to claim 1, wherein said second layer is provided in the first layer throughout the same.

4. A semiconductor device according to claim 1, wherein said surface layer is located near but spaced from the boundary of said first and surface layers.

5. A semiconductor device according to claim 1, wherein said one conductivity type is an n conductivity type.

6. A semiconductor device according to claim 5, wherein the impurity concentration of the surface layer is $5 \times 10^{18}$ to $5 \times 10^{19}$ atoms/cm³.

7. A semiconductor device according to claim 5, wherein the impurity concentration of the first layer is $1 \times 10^{16}$ to $1 \times 10^{17}$ atoms/cm³.

8. A semiconductor device according to claim 7, wherein the first layer is an epitaxial layer.

9. A semiconductor device comprising:
    a D.C. voltage supply region comprising a silicon substrate of a P conductivity type having at least a surface layer having an impurity concentration of $5 \times 10^{18}$ to $5 \times 10^{19}$ atoms/cm³;
    a first layer provided on the surface layer and comprising an epitaxial layer of P conductivity type having an impurity concentration of $1 \times 10^{16}$ to $1 \times 10^{17}$ atoms/cm³;
    a second thin layer of n conductivity type having an impurity concentration of $1 \times 10^{13}$ to $1 \times 10^{14}$ atoms/cm² and formed in the first layer near but spaced from the boundary of the first and surface layers;
    a grounding region having a surface impurity concentration of $1 \times 10^{20}$ atoms/cm³ or more formed in the first layer, and which surrounds a specified region of the first layer and extends from the surface of the first layer to the second layer and provides a signal input region as defined by the surrounded specified region;
    at least one signal output region comprising a layer of n conductivity type having an impurity concentration of $1 \times 10^{13}$ to $1 \times 10^{14}$ atoms/cm³ and provided in the surface of the signal input region at a position spaced apart from the grounding region;
    and a third layer having an impurity concentration of $1 \times 10^{14}$ to $1 \times 10^{15}$ atoms/cm³ provided in the signal input region between the grounding region and the signal output region, wherein the surface layer, the second layer and the signal input region constitute a vertical pnp transistor, and the second layer, the signal input region and the signal output region constitute a vertical npn transistor.

10. A semiconductor device according to claim 9 wherein there are two signal output regions and further comprising a fourth layer having an impurity concentration of $1 \times 10^{14}$ to $1 \times 10^{15}$ atoms/cm³ provided in the signal input region and between the two signal output regions.

11. A process for manufacturing a semiconductor device comprising:
    forming on a semiconductor substrate of high impurity concentration and of one conductivity type to serve as a D.C. voltage supply region a first layer having an impurity concentration lower than that of the substrate and of the same conductivity type as that of the substrate;
    forming a thin buried second layer having an impurity concentration intermediate that of the substrate and the first layer, and of opposite conductivity type to that of the substrate, within said first layer and near the substrate by doping impurities in said first layer by an ion implantation;
    forming a region of said opposite conductivity type in the first layer by forming a mask on the surface thereof and doping impurities in a manner that the impurities extend from the outside surface of the first layer to the buried layer, thereby surrounding a specified region of the first layer to provide a signal input region defined by the surrounded specified region; and
    forming an opening at a prescribed position of the mask and doping impurities in the signal input region, thereby forming therein at least one signal output region of said opposite conductivity type.

12. A process for manufacturing a semiconductor device comprising:

forming on a semiconductor substrate of high impurity concentration and of one conductivity type to serve as a D.C. voltage supply region a first layer having an impurity concentration lower than that of the substrate and of the same conductivity type as that of the substrate;

forming a thin buried layer having an impurity concentration intermediate that of the substrate and the first layer and of the opposite conductivity type to that of the in said first layer near the substrate, by doping impurities in said first layer by an ion implantation;

forming a grounding region of said opposite conductivity type in the first layer by doping impurities, using a mask formed of silicon nitride, in a manner that the impurities extend from the surface of said first layer to said buried layer, thereby surrounding a specified region of the first layer to provide a signal input region defined by the surrounded specified region;

forming at least one signal output region by doping impurities using said silicon nitride mask;

forming a silicon oxide film on the surface of the grounding region;

removing said silicon nitride mask to expose the surface of said surrounded specified region leaving said silicon oxide layer; and forming a second layer of high impurity concentration and of said one conductivity type in said surrounded specified region by doping impurities from said exposed surface of the surrounded specified region, using said silicon oxide film as a mask.

* * * * *